(12) United States Patent
Lin

(10) Patent No.: US 10,104,796 B1
(45) Date of Patent: Oct. 16, 2018

(54) DATA STORAGE SECURING DEVICE

(71) Applicants: HONG FU JIN PRECISION INDUSTRY (WuHan) CO., LTD., Wuhan (CN); HON HAI PRECISION INDUSTRY CO., LTD., New Taipei (TW)

(72) Inventor: Kuan-Yu Lin, New Taipei (TW)

(73) Assignees: HONG FU JIN PRECISION INDUSTRY (WuHan) CO., LTD., Wuhan (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 15/722,079

(22) Filed: Oct. 2, 2017

(30) Foreign Application Priority Data

Jun. 26, 2017 (CN) .......................... 2017 1 0492887

(51) Int. Cl.
| | |
|---|---|
| *H05K 7/00* | (2006.01) |
| *H05K 7/14* | (2006.01) |
| *G06F 1/18* | (2006.01) |
| *G11B 33/12* | (2006.01) |

(52) U.S. Cl.
CPC .......... *H05K 7/1428* (2013.01); *G06F 1/187* (2013.01); *G11B 33/128* (2013.01); *H05K 7/1405* (2013.01); *H05K 7/1418* (2013.01); *H05K 7/1461* (2013.01)

(58) Field of Classification Search
CPC .. H05K 7/1428; H05K 7/1405; H05K 7/1418; H05K 7/1461; G06F 1/187; G11B 33/128

USPC .......................................................... 361/747
See application file for complete search history.

(56) References Cited

U.S. PATENT DOCUMENTS

| | | | | |
|---|---|---|---|---|
| 5,122,566 | A * | 6/1992 | Burroway | C08F 212/04 524/457 |
| 6,398,325 | B1 * | 6/2002 | Chen | G06F 1/181 292/128 |
| 7,558,058 | B2 * | 7/2009 | Hidaka | G11B 33/126 361/679.38 |
| 8,116,086 | B2 * | 2/2012 | Huang | G06K 19/077 361/730 |
| 8,228,687 | B2 * | 7/2012 | Huang | G11B 33/124 361/756 |

* cited by examiner

*Primary Examiner* — Hung S Bui
(74) *Attorney, Agent, or Firm* — ScienBiziP, P.C.

(57) ABSTRACT

A data storage securing device configured to receive a data storage comprises a shell, a bracket slidably installed in the shell, and a locking module. The shell defines a through hole, and a pressing member is located at the front end of the through hole. The bracket comprises a resilient piece received in the through hole and a plurality of blocks. The locking module comprises a body slidably installed in the shell and a button. The body comprises a plurality of baffles, the button is pressed to push the body, and the plurality of baffles is disengaged from the blocks. When the bracket slides along the shell, the pressing member is pressed against the resilient piece, and the resilient piece is elastically deformed to abut against the data storage, to prevent the data storage from falling off.

20 Claims, 8 Drawing Sheets

DATA STORAGE SECURING DEVICE

CROSS-REFERENCE TO RELATED APPLICATIONS

This application claims priority to Chinese Patent Application No. 201710492887.4 filed on Jun. 26, 2017 the contents of which are incorporated by reference herein.

FIELD

The subject matter herein generally relates to data storage structural security.

BACKGROUND

There are many data storage devices installed inside the computer. In order to facilitate the removal of the data storage devices, a pop-out mechanism can be implemented. However, a data storage device often suffers damages during the removal process due to the absence of a stopping mechanism, allowing the entire device to be ejected.

BRIEF DESCRIPTION OF THE DRAWINGS

Implementations of the present disclosure will now be described, by way of example only, with reference to the attached figures.

DETAILED DESCRIPTION

Figure 1:
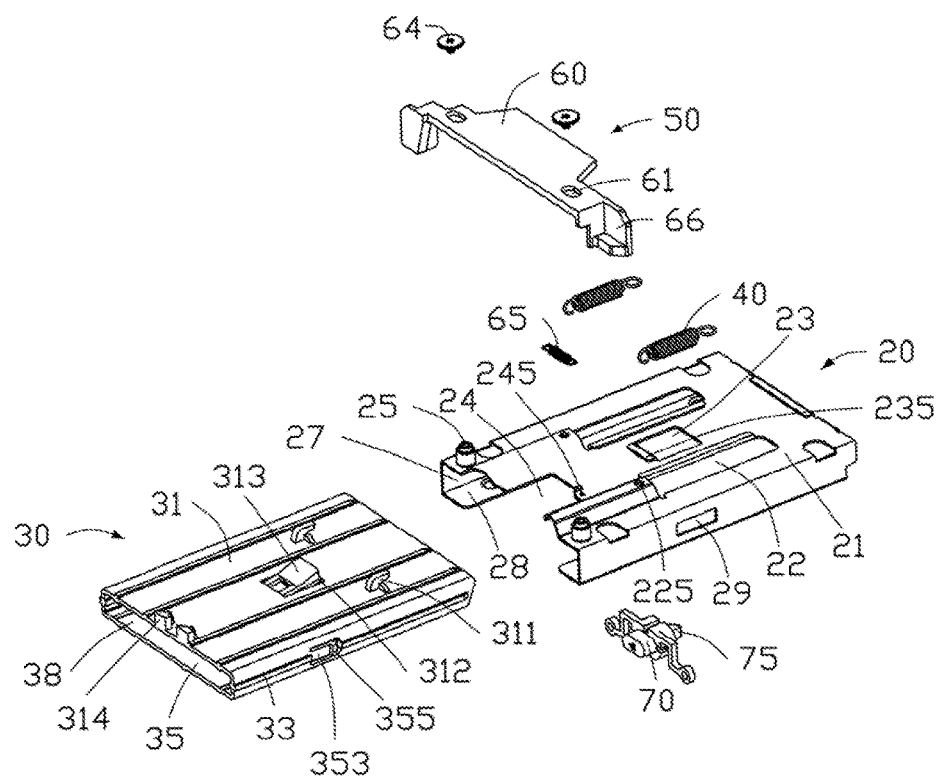
FIG. 1 is an exploded view of a first exemplary embodiment of a data storage securing device.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the exemplary embodiments described herein.

Several definitions that apply throughout this disclosure will now be presented.

The term "outside" refers to a region that is beyond the outermost confines of a physical object. The term "inside" indicates that at least a portion of an object is contained within a boundary formed by another object. The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising" means "including but not necessarily limited to"; it specifically indicates open-ended inclusion or membership in a so-described combination, group, series, and the like.

Figure 3:
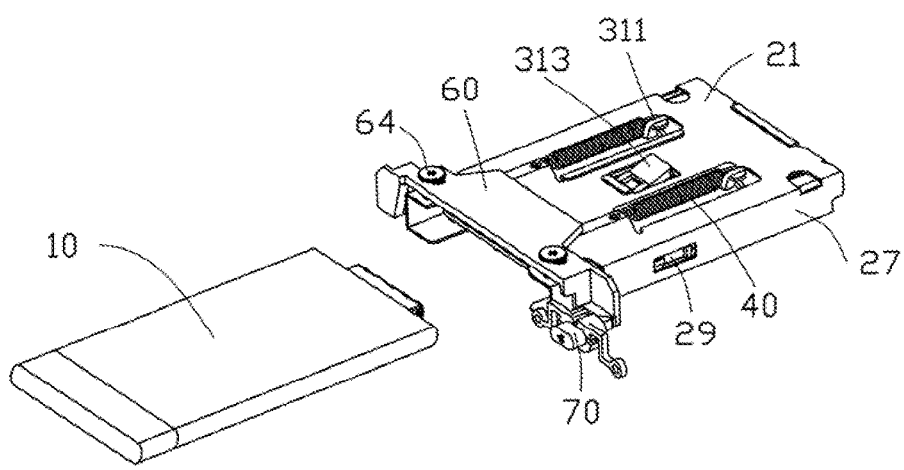
FIG. 3 is an exploded view of the data storage securing device of FIG. 1 and a data storage.

FIG. 1 illustrates one exemplary embodiment of a data storage securing device 100 configured to receive at least one data storage (shown in FIG. 3). The data storage securing device 100 includes a shell 20 secured in an electronic device (not shown), a bracket 30 configured to receive the data storage, and a locking module 50.

Figure 2:
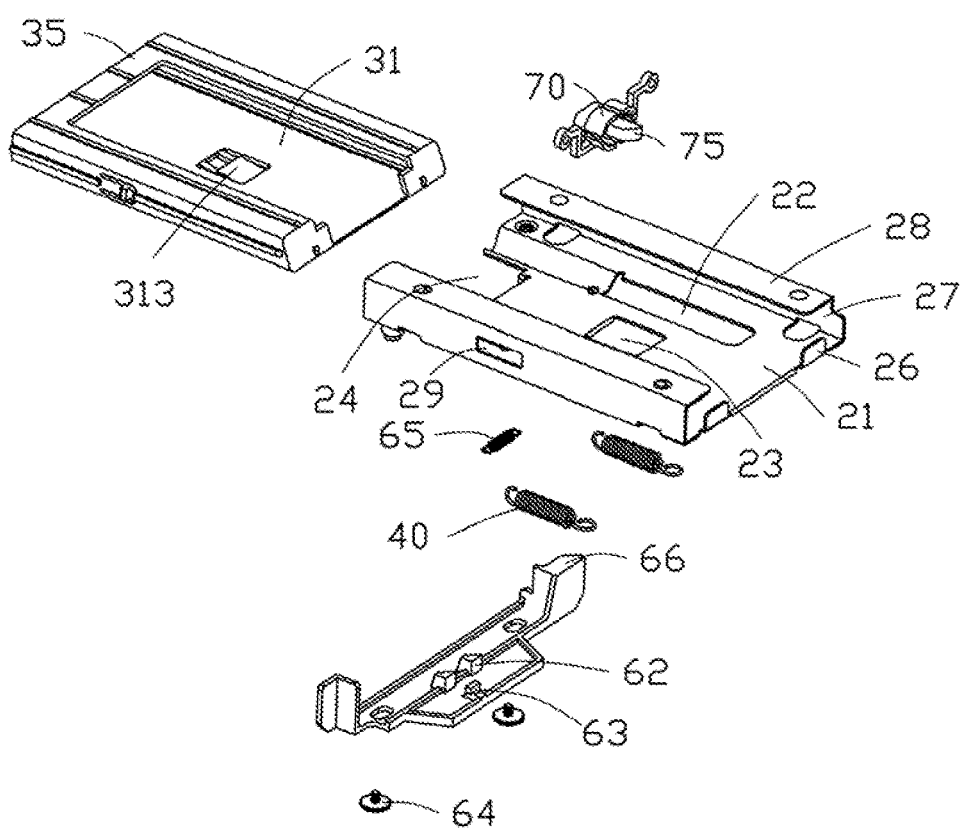
FIG. 2 is similar to FIG. 1, but viewed from another angle.

FIG. 1 and FIG. 2 illustrate that the shell 20 includes a top plate 21 and two side plates 27 connected to ends of the top plate 21.

The top plate 21 is provided with two parallel slides 22. The top plate 21 is also provided with a fixing hole 225 at a front end of each of the slides 22. One end of the two first resilient members 40 is inserted into the fixing hole 225. The top plate 21 defines a through hole 23 between the two slides 22. A pressing member 235 is located at the front end of the through hole 23. A notch 24 is defined in the middle portion of the front end of the top plate 21. A latch 245 is provided on one side of the notch 24. The two sides of the front end of the top plate 21 are also provided with a positioning post 25, the locking module 50 is installed on the positioning post 25. The rear end of the top plate 21 is provided with two positioning plates 26 for preventing the data storage 10 from falling off.

The bottom ends of each side plate 27 are bent toward each other to form a supporting plate 28. The bracket 30 is slidably mounted in the shell 20 along the supporting plate 28. The middle portion of each side plate 27 defines a limiting hole 29 for sliding the bracket 30 within a fixed range.

The bracket 30 includes a top wall 31, a bottom wall 33 parallel to the top wall 31, and two sidewalls 35 connecting the top wall 31 and the bottom wall 33. The top wall 31, the bottom wall 33, and the two sidewalls 35 cooperatively define a receiving space 38. The data storage 10 can received in the receiving space 38. The top wall 31 is provided with two hooks 311, and each hook 311 can be slid in the slide 22. The other end of each first resilient member 40 can be fitted to the hook 311. The top wall 31 is provided with an opening 312 corresponding to the through hole 23 and resilient piece 313 at the front end of the opening 312. The thickness of the end of the resilient piece 313 is larger than the thickness of the top wall 31. The resilient piece 313 protrudes from the upper surface of the top wall 31 and is elastically deformed to be accommodated in the through hole 23. The front end of the top wall 31 is provided with two blocks 314, and a gap is formed between the two blocks 314. Each sidewall 35 is resiliently connected with a limiting plate 353, and the end of each limiting plate 353 is provided with a projection 355. The limiting plate 353 can be slid into the limiting hole 29.

The locking module 50 includes a body 60 and a button 70 cooperating with the body 60. The body 60 is provided with two sliding grooves 61, a plurality of fasteners 64 can pass through the sliding groove 61 and be inserted into the positioning post 25 to slidably mount the body on the shell 20. The bottom end of the body 60 is provided with two baffles 62, and the two baffles 62 are pressed against the corresponding blocks 314 to prevent the bracket 30 from slipping out of the shell 20. The two baffles 62 can pass through the gap between the two blocks 314. The bottom end of the body 60 is also provided with a grab 63, and the ends of a second resilient member 65 are respectively latched on the grab 63 and the latch 245. The body 60 is provided with a drive plate 66 on both sides adjacent to the latch 245. The button 70 includes a pressing block 75, and the pressing block 75 is configured to press one of the drive plate 66 to slide the body 60.

Figure 4:
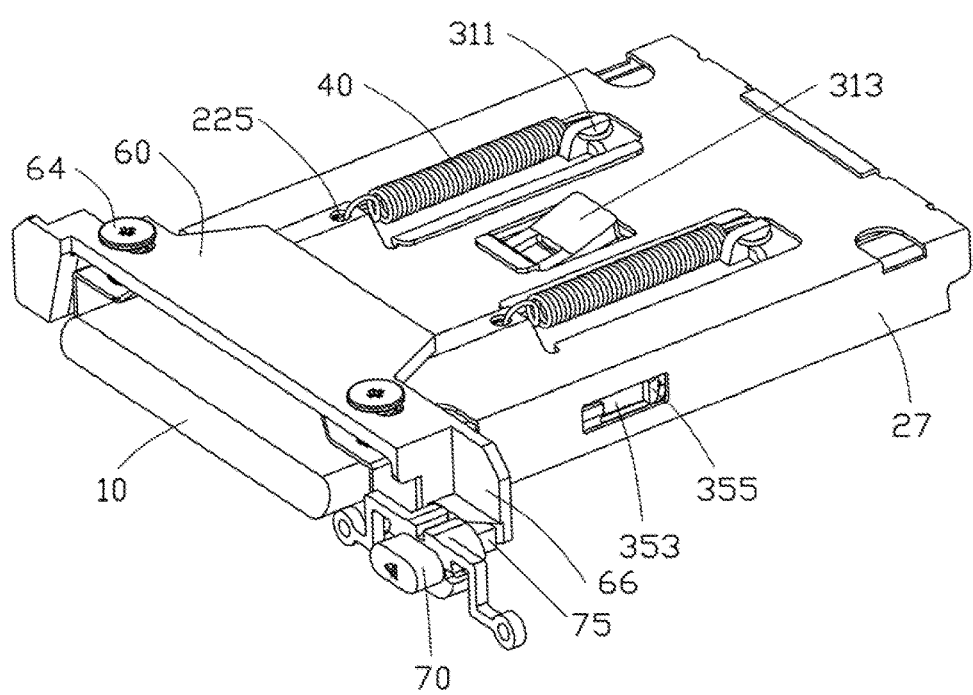
FIG. 4 is an assembled view of the data storage securing device and the data storage of FIG. 3, with a button not being pressed.

FIG. 3 and FIG. 4 illustrate an assembly of the data storage securing device 100. The bracket 30 is slid into the shell 20 along the supporting plate 28. The resilient piece 313 of the top wall 31 elastically rebounds to be received in the through hole 23. The two hooks 311 of the top wall 31 are respectively received in the two slides 22 of the top plate 21 and can be slid along the slides 22. Each first resilient member 40 is elastically stretched, the ends are secured on the fixing hole 225 and the hook 311. The block 314 of the top wall 31 is received in the notch 24 of the top plate 21. The limiting plate 353 of the sidewall 35 elastically rebounds to be received in the limiting hole 29 of the side plate 27. At this time, the bracket 30 is slidably mounted in the shell 20.

The body 60 is placed over the shell 20. The second resilient member 65 is compressed and its ends are respectively received in the grab 63 of the body 60 and the latch 245, so that the baffle 62 abuts against the block 314. The fastener 64 passes through the sliding groove 61 and is inserted into the positioning post 25 to secure the body 60 to the shell 20. Then the shell 20 and the button 70 are fixed to the electronic device. Thus, the data storage securing device 100 is assembled completely.

Figure 5:
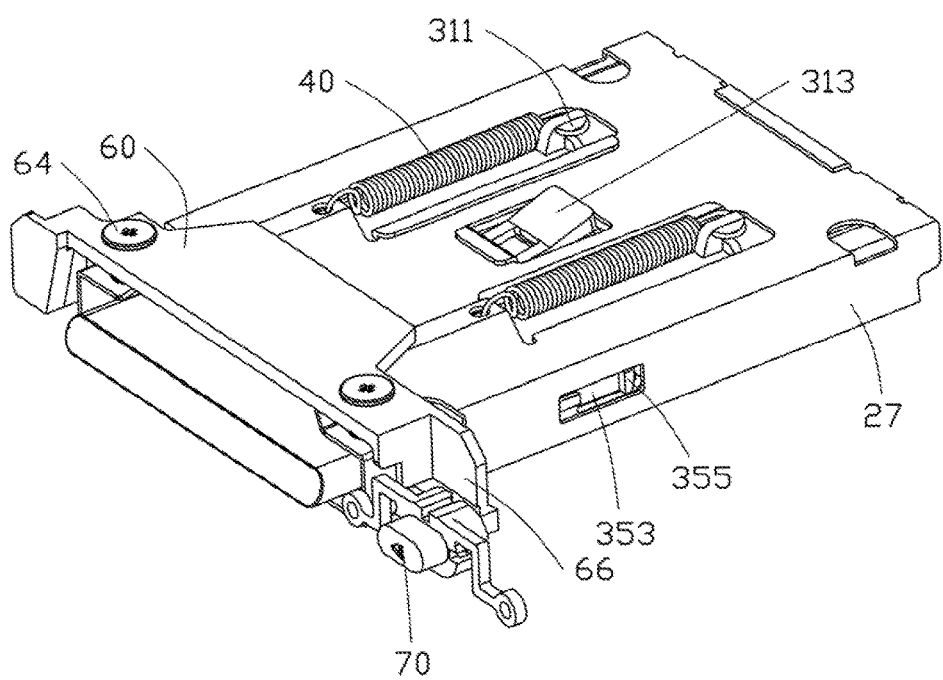
FIG. 5 is similar to FIG. 4, with the button being pressed.
Figure 6:
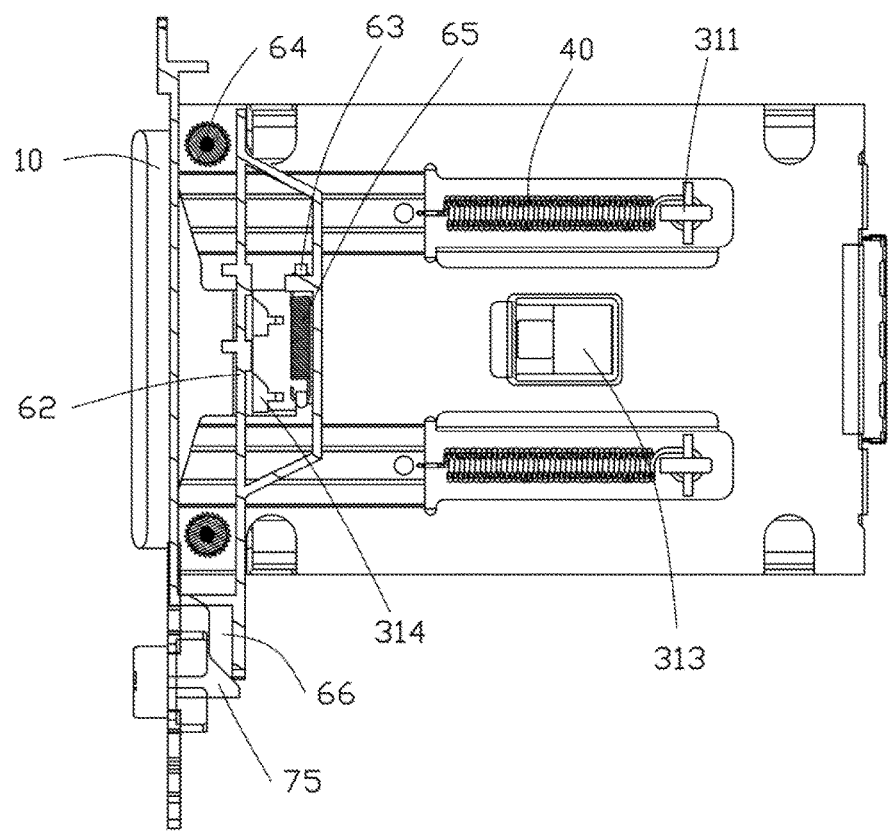
FIG. 6 is a cutaway view of the data storage securing device and the data storage of FIG. 5.
Figure 7:
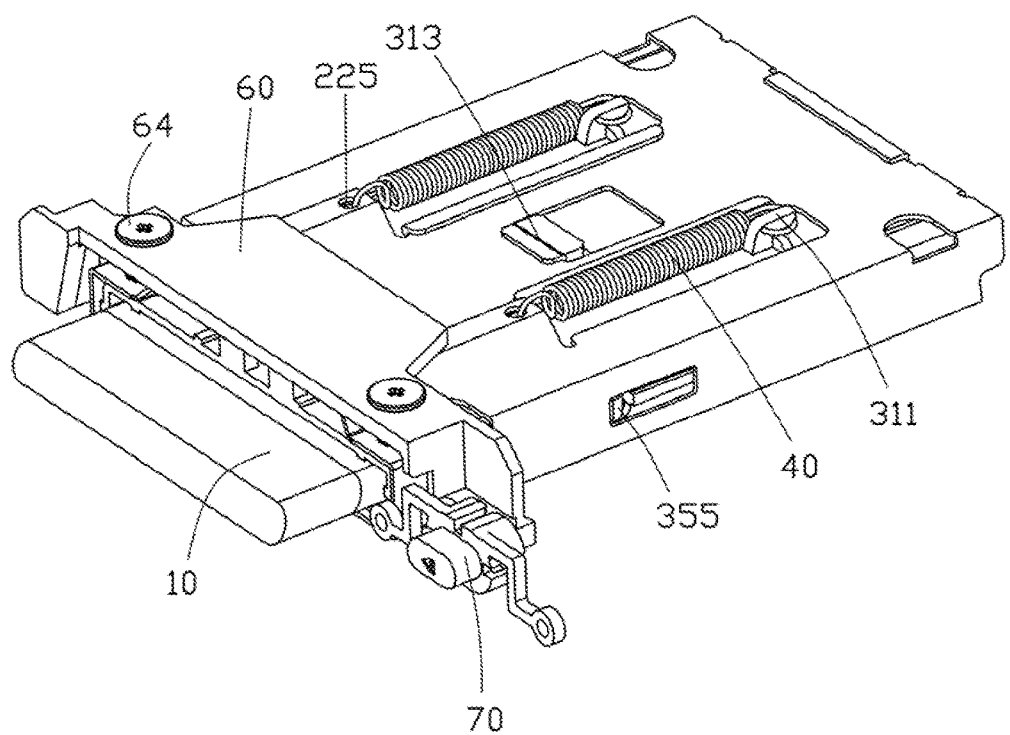
FIG. 7 is similar to FIG. 4, the data storage has popped-up.

FIGS. 5, 6 and 7 illustrate that the data storage 10 is inserted into the receiving space 38. When the data storage 10 needs to be removed, the button 70 is pressed and the pressing block 75 is pressed against the drive plate 66 to slide the body 60. The second resilient member 65 is elastically stretched and the baffle 62 is disengaged from the block 314. The two first resilient members 40 elastically rebound to pull the hook 311, and drive the bracket 30 and the data storage 10 to slide in the direction of the body 60. The resilient piece 13 is elastically deformed by receiving the pressing of the pressing member 235 during the sliding. When the projection 355 of the limiting plate 353 abuts against the side plate 27 at the front end of the limiting hole 29, the bracket 30 stops sliding. The resilient piece 313 presses the data storage 10 to stop the data storage from sliding and falling off due to the frictional force between the resilient piece 313 and the data storage 10.

Figure 8:
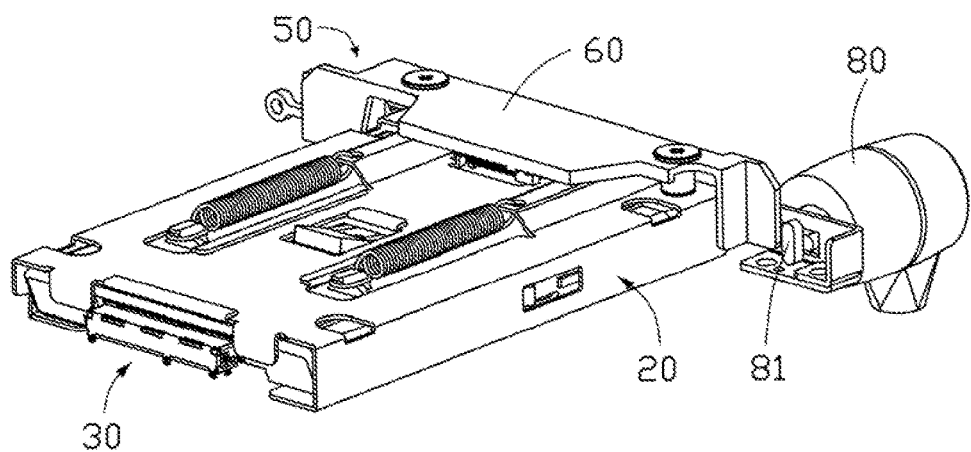
FIG. 8 is an assembled view of a second exemplary embodiment of a data storage securing device.

FIG. 8 illustrates a second exemplary embodiment of the data storage securing device 100. With similar numerals representing similar features in FIG. 1, the data storage securing device 100 in FIG. 8 further includes a shell 20 secured in an electronic device (not shown), a bracket 30 configured to receive the data storage, a locking module 50, and a safety device 80.

With reference to FIGS. 6, 7 and 8, the safety device 80 is mounted on the electronic device. The safety device 80 and the button are respectively located on sides of the body 60. The safety device 80 includes a latching member 81, the latching member 81 abuts against the drive plate 66 to prevent the body 60 from sliding. Thus, when the button 70 is pressed, the body 60 cannot slide due to the stopping of the latching member 81, and the baffle 62 cannot be disengaged from the block 314, so that the bracket 30 and the data storage 10 cannot slide out of the electronic device, to avoid unauthorized removal.

The exemplary embodiments shown and described above are only examples. Many details are often found in the art such as the other features of data storage securing device. Therefore, many such details are neither shown nor described. Even though numerous characteristics and advantages of the present disclosure have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will therefore be appreciated that the exemplary embodiments described above may be modified within the scope of the claims.

What is claimed is:

1. A data storage securing device configured to secure a data storage, comprising:
a shell defining a through hole and a pressing member being located at a front end of the through hole;
a bracket slidably installed in the shell, comprising a resilient piece received in the through hole and a plurality of blocks; and
a locking module comprising a body slidably installed in the shell and a button;
wherein the body comprises a plurality of baffles, the button is pressed to push the body, and the plurality of baffles is disengaged from the blocks; when the bracket slides along the shell, the pressing member is pressed against the resilient piece, the resilient piece is elastically deformed to abut against the data storage to prevent the data storage from falling off.

2. The data storage securing device of claim 1, wherein the shell comprises a top plate, the through hole and the pressing member are located on the top plate.

3. The data storage securing device of claim 2, wherein the top plate is provided with two slides, the top wall is provided with two hooks, the hooks are configured to be slid along two sides of the top plate.

4. The data storage securing device of claim 3, wherein the top plate defines a fixing hole at a front end of each slide, the data storage securing device further comprises two first resilient members, two ends of each of the two first resilient members are respectively secured on the fixing hole and each of the two hook; when the baffles are disengaged from the blocks, each of the two first resilient members is elastically constricted to push the bracket sliding along the shell.

5. The data storage securing device of claim 4, wherein the shell comprises two side plates connected to the two sides of the top plate, each of the two side plates defines a limiting hole, the bracket comprises two sidewalls, each of the two sidewalls is provided with a limiting plate, each of the limiting plates is inserted into the limiting hole.

6. The data storage securing device of claim 5, wherein a front end of the top plate defines a notch, the plurality of blocks is received in the notch.

7. The data storage securing device of claim 6, wherein the top plate is provided with a latch at one side of the notch, the body comprises a grab, two ends of a second resilient member are respectively secured on the grab and the latch.

8. The data storage securing device of claim 7, wherein the top plate is provided with two positioning post at both sides of the notch, the body defines two sliding grooves, two fasteners pass through the two sliding grooves to be inserted into the positioning post to slidably install the body on the shell.

9. The data storage securing device of claim 1, wherein the bracket comprises a top wall, the resilient piece and the blocks are located on the top wall.

10. The data storage securing device of claim 1, wherein one end of the body is provided with a drive plate, the button comprises a pressing block, the button is pressed and is abutted against the drive plate to slide the body, a second resilient member is elastically stretched.

11. A data storage module comprising:
a data storage; and
a data storage securing device configured to receive the data storage, comprising:
a shell defining a through hole and a pressing member being located at the front end of the through hole;
a bracket slidably installed in the shell, comprising a resilient piece received in the through hole and a plurality of blocks; and
a locking module comprising a body slidably installed in the shell and a button;
wherein the body comprises a plurality of baffles, the button is pressed to push the body, and the plurality of baffles is disengaged from the blocks; when the bracket slides along the shell, the pressing member is pressed against the resilient piece, the resilient piece is elastically deformed to abut against the data storage to prevent the data storage from falling off.

12. The data storage module of claim 11, wherein the shell comprises a top plate, the through hole and the pressing member are located on the top plate.

13. The data storage module of claim 12, wherein the top plate is provided with two slides, the top wall is provided with two hooks, the hooks are configured to be slid along two sides of the top plate.

14. The data storage module of claim 13, wherein the top plate defines a fixing hole at a front end of each slide, the data storage securing device further comprises two first resilient members, two ends of each of the two first resilient members are respectively secured on the fixing hole and each of the two hook; when the baffles are disengaged from the blocks, each of the two first resilient members is elastically constricted to push the bracket sliding along the shell.

15. The data storage module of claim 14, wherein the shell comprises two side plates connected to the two sides of the top plate, each of the two side plates defines a limiting hole, the bracket comprises two sidewalls, each of the two sidewalls is provided with a limiting plate, each of the limiting plates is inserted into the limiting hole.

16. The data storage module of claim 15, wherein a front end of the top plate defines a notch, the plurality of blocks is received in the notch.

17. The data storage module of claim 16, wherein the top plate is provided with a latch at one side of the notch, the body comprises a grab, two ends of a second resilient member are respectively secured on the grab and the latch.

18. The data storage module of claim 17, wherein the top plate is provided with two positioning post at both sides of the notch, the body defines two sliding grooves, two fasteners pass through the two sliding grooves to be inserted into the positioning post to slidably install the body on the shell.

19. The data storage module of claim 11, wherein the bracket comprises a top wall, the resilient piece and the blocks are located on the top wall.

20. The data storage module of claim 11, wherein one end of the body is provided with a drive plate, the button comprises a pressing block, the button is pressed and is abutted against the drive plate to slide the body, the second resilient member is elastically stretched.

\* \* \* \* \*